United States Patent [19]

Jones et al.

[11] Patent Number: 4,818,359
[45] Date of Patent: Apr. 4, 1989

[54] LOW CONTAMINATION RF SPUTTER DEPOSITION APPARATUS

[75] Inventors: Fletcher Jones, Ossining; Joseph S. Logan, Poughkeepsie, both of N.Y.

[73] Assignee: International Business Machines Corporation, Armonk, N.Y.

[21] Appl. No.: 127,540

[22] Filed: Dec. 1, 1987

Related U.S. Application Data

[63] Continuation of Ser. No. 900,959, Aug. 27, 1986, abandoned.

[51] Int. Cl.$^4$ ............................................. C23C 14/34
[52] U.S. Cl. ................................ 204/298; 204/192.12; 204/192.32
[58] Field of Search ........... 204/192.1, 192.12, 192.32, 204/298; 156/345

[56] References Cited

U.S. PATENT DOCUMENTS

| | | | |
|---|---|---|---|
| 3,617,459 | 11/1971 | Logan | 204/298 X |
| 4,131,533 | 12/1978 | Bialko et al. | 204/298 |
| 4,362,611 | 12/1982 | Logan et al. | 204/298 |
| 4,464,223 | 8/1984 | Gorin | 204/298 X |
| 4,521,286 | 6/1985 | Hortwitz | 204/298 X |
| 4,626,312 | 12/1986 | Tracy | 204/298 X |
| 4,637,853 | 1/1987 | Bumble et al. | 204/298 X |

FOREIGN PATENT DOCUMENTS

| | | |
|---|---|---|
| B10003020 | 1/1983 | European Pat. Off. . |
| A20180020 | 3/1984 | European Pat. Off. . |
| A2013983 | 5/1985 | European Pat. Off. . |
| 60-75587 | 8/1985 | Japan . |
| 60-63367 | 8/1985 | Japan . |

Primary Examiner—Nam X. Nguyen
Attorney, Agent, or Firm—Philip J. Feig

[57] ABSTRACT

A high rate, low contamination, non-reactive sputter etching or deposition apparatus is disclosed herein. The apparatus is comprised of a pair of parallel plate electrodes, cathode and substrate and an additional or wall electrode means surrounding said other electrode means. The wall electrode can be made to be coplanar with said other electrodes and the area of said electrodes are designed so that the wall electrode is resputtered eliminating contamination. The electrodes are housed in a vacuum chamber with inlet means for introducing a non-reactive gas into said chamber. Means are provided for supplying said RF voltage to said electrodes both in and out of phase and for varying the magnitude of the substrate electrode RF voltage with respect to the magnitude of the cathode voltage. Thick insulator rings are used to reduce stray capacitance between the wall electrode and ground whereby the outer chamber (normally grounded) forms a low inductance path between the cathode electrode and acts as a shield for the inner chamber RF potential.

9 Claims, 12 Drawing Sheets

PEAK HEIGHT IN MICRONS OVER 1.0 MICRON METAL

LOW CONTAMINATION RF SPUTTER DEPOSITION APPARATUS

This application is a continuation of application Ser. No. 06/900,959 filed on Aug. 27, 1986, abandoned.

BACKGROUND OF THE INVENTION

Field of the Invention

The present invention relates to radio frequency (RF) sputtering systems and more particularly to a low contamination, high deposition rate sputtering apparatus for the etching and deposition of insulator films, of such materials as $SiO_2$ on semiconductor device wafers.

DESCRIPTION OF RELATED ART

RF sputtering is a well known technique in the art of dry process etching and deposition. In brief, it is a type of diode sputtering with a cathode electrode, an effective anode, and a plasma within a vacuum chamber. The electrodes are typically driven at high voltage (600–1500 volts) and high frequency (13.56 megahertz). The plasma is formed by the high voltage induced breakdown of the gas in the chamber, and typically assumes a small positive potential relative to ground, which is the potential of the chamber walls. All electrodes develop a negative dc bias with respect to the plasma. However, the cathode is usually smaller than the anode so that a high negative dc bias is developed on it with respect to the plasma. The cathode electrode is bombarded at high energy by ions in the plasma during the "negative" portion of the applied voltage and by electrons during the "positive" part. Thus, no net charge flows through the cathode electrode. The cathode electrode is sputtered by the high energy ion bombardment. This sputtering is used either for erosion of samples on the cathode surface, or net deposition on samples placed on an opposing surface with suitable support. For a more detailed discussion of RF sputtering, one can refer to B. Chapman, "Glow Discharge Process," J. Wiley and Sons, N.Y. 1980, pp. 135–173.

Current manufacturing capability for depositing sputtered $SiO_2$ on semiconductor device wafers has evolved from small batch tools to very large batch tools capable of holding as many as 20–82 mm dia. wafers. In these very large batch tools, the $SiO_2$ target diameter may be as large as 61 cm (24 in.) and deposition run times are approximately 5 to 6 hours at a deposition rate of 250 Å/min. for "standard" $SiO_2$ and 125 Å/min. for "planar" $SiO_2$. Long cycle times, plus the necessity of batching wafers makes this operation expensive and logistically difficult for manufacturing.

However, development of a single wafer tool, with comparable through-put to the batch wafer tools, requires a tool with a deposition rate of about 20 times as the rate for current batch tools. This is a deposition rate of approximately 5000 Å/min.

Such high rate diode sputtering of $SiO_2$ has been reported by Grantham et al, Journal of Vacuum Science Technology, Volume 7, pp. 343 (1970). This unit used a strong axial magnetic field, differential pumping of the cathode insulator and RF power density of about $50w/cm^2$ to achieve deposition rate of about 5000 Å/min. However, at such high target sheath voltages and power densities, sputtering efficiencies are known to be low and losses very high. Furthermore, such use of magnetic fields causes radial non-uniformity.

To obtain the sought after high deposition rates in an efficient process for use in manufacturing, it is necessary to obtain significantly higher plasma density than is conventionally achievable with known diode RF discharges. In addition, with such high deposition rates, the apparatus must be designed to reduce accumulation of material in the chamber which can cause particulate contamination of the wafer.

In the art of radio frequency (RF) sputter deposition, one technique for control of the degree of resputtering of the substrate electrode in a diode (two-electrode) system has been by varying the ratio of source electrode area to substrate electrode area. (Koenig and Maissel, IBM Journal Res. & Dev., Vol. 14, No. 2, March 1970, pp. 168–171.) This, in principle, will allow adjustment of the substrate material balance from deposition to etching. However, unless one is using the entire substrate area for useful material collection, part of the substrate area must be periodically cleaned and will be potentially a source of particulates. This has been also true, in general, for the 3-electrode systems controlled by substrate-tuning (see U.S. Pat. No. 3,617,459), or by control using a separate source of RF power. Here, material collects on the third or "wall" electrode, as well as on unused portions of the substrate electrode.

A different apparatus known in the prior art for high plasma density by geometrical confinement has been the RF hollow-cathode, which has been used for reactive ion etching.

In U.S. Pat. No. 4,521,286 issued to Horowitz on June 4, 1985 and assigned to Unisearch Limited of Kensington, Australia, one type of RF hollow cathode sputter etcher is taught for controlling the speed and directionality of the plasma in a chemically reactive process. However, this is a chemically reactive process, and the etched silicon (Si) is pumped out of the chamber with the other etch products combined with the reactive gas. Wherein, the removal of silicon by reactive gas is inapplicable to physical sputtering and there is no teaching for controlling material accumulation on the chamber walls.

It is therefore an object of the present invention to provide a physical sputter etcher and deposition apparatus wherein very high deposition rates can be achieved at low voltage or high plasma density.

It is a further object of the present invention that the design of the chamber of the apparatus is such that material accumulation on the walls of said chamber is greatly reduced or reduced to the point of being removed entirely.

It is a still further object of the present invention that the plasma potential within the chamber be controlled so that re-sputtering of the substrate can be controlled.

SUMMARY OF THE INVENTION

A high rate, low contamination, non-reactive sputter etching or deposition apparatus is comprised of a pair of parallel plate electrodes, cathode and substrate and an additional or wall electrode means surrounding said other electrode means. Said additional or wall electrode can be made to be coplanar with said other electrodes. All the electrodes are housed in a vacuum chamber with inlet means for introducing a non-reactive gas into said chamber.

Means are also provided for supplying said RF voltage to said electrodes and for varying the magnitude of the substrate electrode RF voltage with respect to the magnitude of the cathode voltage.

Thick insulator rings are used to reduce stray capacitance between the wall electrode and ground whereby the outer chamber (normally grounded) forms a low inductance path between the cathode electrode and substrate electrode and acts as a shield for the inner chamber RF potential.

In one embodiment, the in-phase mode, the area of said wall electrode is made approximately equal to or slightly larger than the sum of said cathode and substrate electrode areas and the substrate voltage is adjusted with respect to the cathode voltage by a variable capacitor, between the substrate electrode and the cathode.

In another embodiment, the tuned substrate mode, the area of said wall electrode is made to be approximately equal to the substrate area, and an inductive tuned network is used to vary the substrate RF bias voltage with respect to the plasma in order to control resputtering of the substrate.

BRIEF DESCRIPTION OF THE DRAWINGS

FIGS. 11.1 and 11.2 are graphs of the influence of changing the inner diameter of the wall electrode on the thickness distribution of the apparatus of FIG. 4.

DETAILED DESCRIPTION OF THE INVENTION

Figure 1:
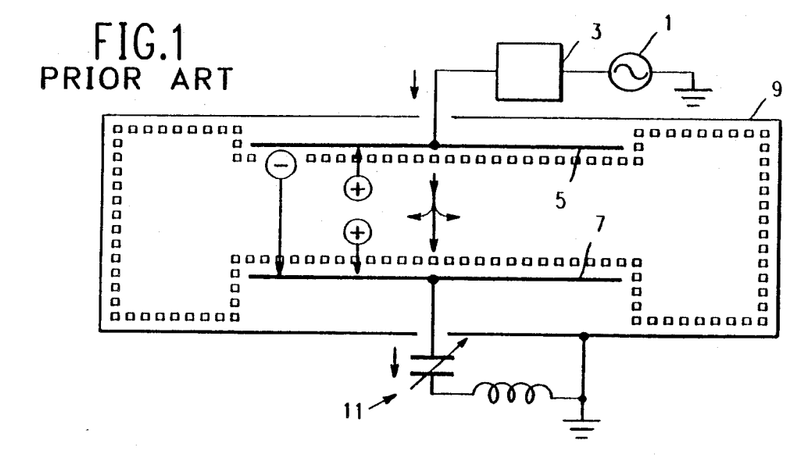
FIG. 1 shows a schematic of a conventional tuned substrate sputtering system as known in the prior art.

A conventional tuned substrate sputtering system is shown schematically in FIG. 1. The RF generator 1 is connected through an appropriate matching network 3 to the cathode (top) electrode 5 to which is attached the target material ($SiO_2$). The substrate electrode 7 (bottom) holds the substrate (silicon wafer) (not shown) and is insulated from the chamber 9 which is grounded. The RF current into the system flows through the cathode 5, into the plasma, and then divides, some flowing into the substrate electrode 7, and the remainder into the wall electrode 9 to ground. An inductive tuned network 11 connects the substrate holder to ground, and is used to vary the substrate RF bias voltage with respect to the plasma in order to control resputtering of the substrate. In this arrangement, the phase of the target and substrate sheath RF voltages is at or near 180 degrees for any condition of resputtering.

Figures 2, 3:
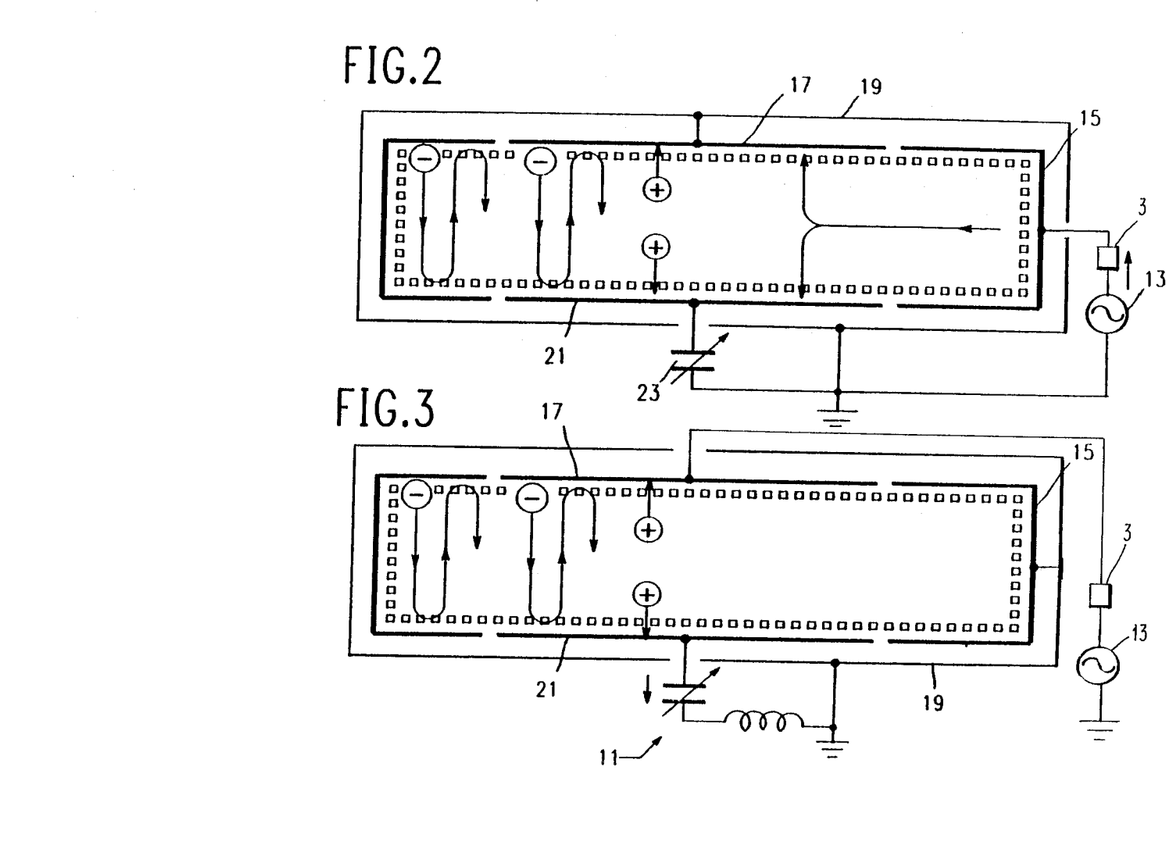
FIG. 2 shows a skeletal schematic cross section of the in-phase sputtering apparatus according to the invention herein.
FIG. 3 shows a skeletal schematic cross section of the tuned substrate sputtering apparatus according to the invention herein.

Turning now to the subject invention, FIG. 2 shows a schematic drawing of the in-phase RF sputtering apparatus. As can be seen in FIG. 2, RF power 13 is applied to the cylindrical inner metal annulus called the wall electrode 15. We have chosen to ground the cathode electrode 17 to the metal vacuum chamber 19, and to insulate the substrate electrode 21 and couple it to ground by a variable capacitor 23. The RF current flow is therefore from the wall electrode 15, into the plasma and then radially inward to ground through both cathode 17 and substrate 21 electrodes. Alternatively, one can ground the wall electrode, and drive both target and substrate with the same connection, again using a variable capacitor to adjust substrate coupling. In either case, the phase relationship between cathode sheath voltage and substrate sheath voltage is near zero for most conditions of resputtering.

As can be seen in the FIG. 2, the wall electrode of the in-phase sputtering system is shaped as a hollow annulus. However, the shape of the wall electrode can be any of a variety of shapes including, but not limited to the annulus shown. The relative areas of the wall electrode (Aw), the target electrode (At), and the substrate electrode (As) are chosen to enhance the sputtering of the wall. For the in-phase mode, the areas follow the approximate relationship Aw is approximately equal to or slightly larger than As+At to cause equal sputtering on the wall and target.

In practice, some additional modification is desirable to compensate for the fact that the substrate sputtering must be less than the target sputtering to obtain a net deposition.

As the substrate capacitance is decreased, less RF current will flow into the substrate electrode, resulting in less substrate self-bias, and less substrate sputter-etching. Therefore, the substrate can accumulate material which has been sputter-etched from the cathode and the wall electrodes. If the cathode and the wall electrode are covered with the desired material, say $SiO_2$, then $SiO_2$ can be deposited on the substrate electrode at a controlled level of re-sputtering. Furthermore, the wall and the cathode electrodes will sputter-etch at approximately the same rate, so that they will have no net accumulation of material.

FIG. 3 shows a skeletal schematic cross section of the tuned substrate sputtering apparatus according to the invention herein. It should be readily apparent that the tuned substrate apparatus of FIG. 3 is mechanically similar in design to the in-phase apparatus of FIG. 2. However, it should be noted that in FIG. 3 the area of the wall electrode is made approximately equal to the substrate electrode and an inductor network has replaced the capacitive network in FIG. 2 and the electrical connections have been changed.

Figure 4:
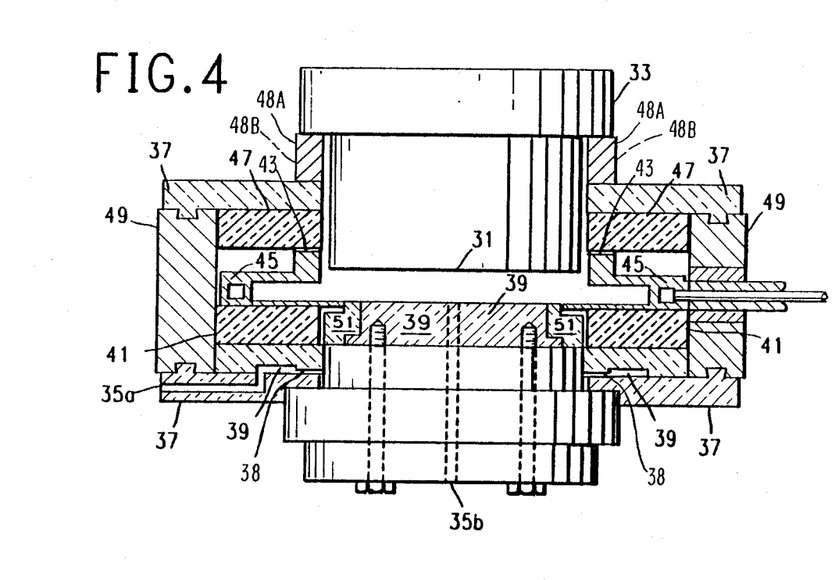
FIG. 4 shows a further, more detailed, cross section of the in-phase apparatus of FIG. 2.

Referring now to FIG. 4, the silica target 31 was a 1.57 mm thick×150 mm dia. plate (Corning type 7940 optical grade) bonded to a water cooled aluminum cathode electrode 33 with indium-tin solder. The thickness of the target plate was chosen to limit the surface temperature rise at full power (11.6 watts/cm$^2$ ion heat load) to less than 120 deg. C. A hole through the cathode structure to the target backside permitted a fiber optic probe to be used for rate monitoring by reflectance of a HeNe laser beam normally incident on the silicon substrate.

Figure 5:
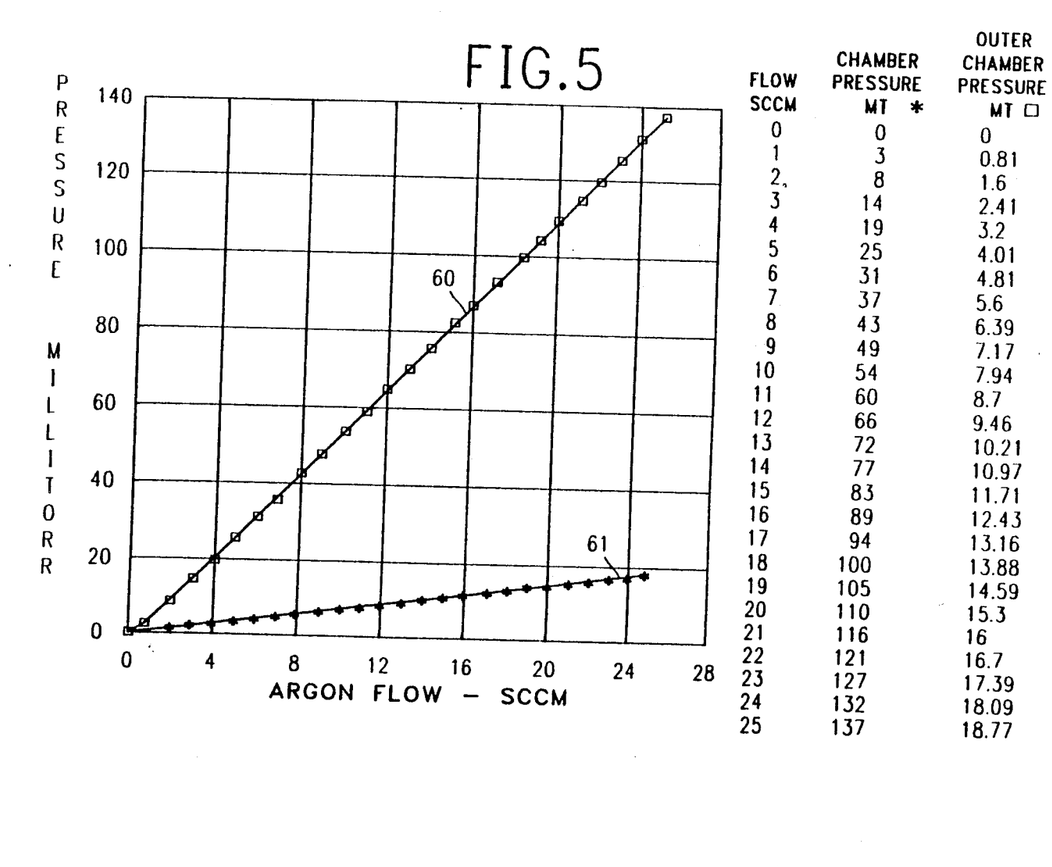
FIG. 5 shows a flow calibration curve for the gas introduced into the apparatus of the subject invention.

Argon gas is introduced from an inlet 35A on the base plate 37, using a gap 38 into the annular space between the water-cooled substrate electrode 39 and the glass-ceramic lower insulator ring 41. Argon was pumped out of the inner chamber through a 0.5 mm throttling gap 43 between the wall electrode 45 and the glass-ceramic upper insulator ring 47. Using this arrangement, the flow-pressure calibration was measured as shown FIG. 5, graphs 60 and 61; the inner chamber pressure 60 was sensed using the cooling gas port 35b in the substrate holder, without a wafer in place, as shown in FIG. 4.

A channel 35B through the substrate electrode 39 and the anodized plate carried argon gas to the wafer backside. The substrate electrode 39 is further surrounded by insulating ring 51.

The wall electrode 45 was a machined and brazed aluminum assembly supported on four rods (not shown). Member 49 encloses the total apparatus. A large pump port (not shown) is provided through member 49.

For the in-phase mode these rods were insulated from member 49. One of the rods was used to supply the r.f. power to the system, and was water cooled. Two of the rods were used to supply water to cool the wall electrode and also to provide a convenient voltage measuring connection. The cathode was grounded to member 49 with a metal ring 48A. Member 49 encloses the total apparatus.

For the tuned substrate mode, the four support rods were grounded to member 49 and the cathode 33 was insulated by a glass ring 48B which replaced metal ring 48A.

The inside diameter of the wall electrode was initially 241 mm, and was later reduced using an insert to 229 mm, giving area ratios (Aw/As+At) of 1.70 and 1.43 respectively in the in-phase mode. These ratios were larger than intended and as a result, the resputtering of the wall electrode in the in-phase mode was not optimized for the data reported herein. All data was taken using a 10 Kw 40.68 MHz r.f. generator from RF plasma products. This frequency was chosen based on a need to obtain the highest possible plasma density at the lowest voltages. All data reported herein for the in-phase mode was for the smallest diameter (229 mm) of the wall electrode. However, in the tuned-substrate mode, additional insert rings were made and tested down to 157 mm dia. giving tuned substrate area ratios (Aw/As) down to 1.04, where substantial wall sputtering was measured.

Figure 6:
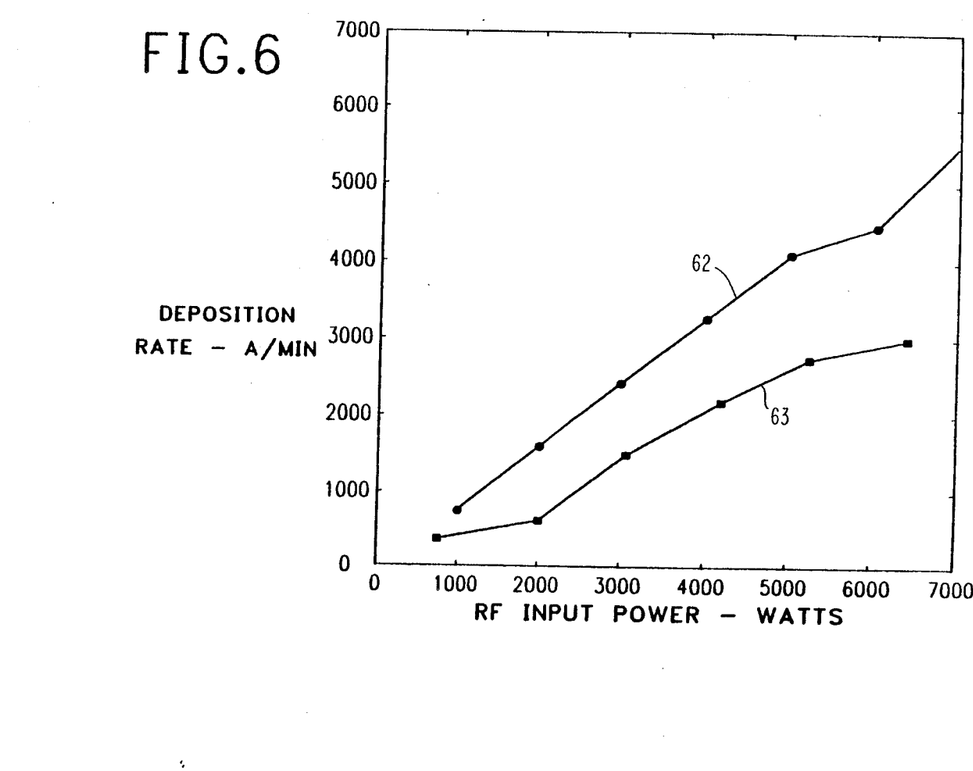
FIG. 6 is a graph of the measured deposition rates for low and high power resputtering with the in-phase apparatus of FIG. 4.
Figure 7:
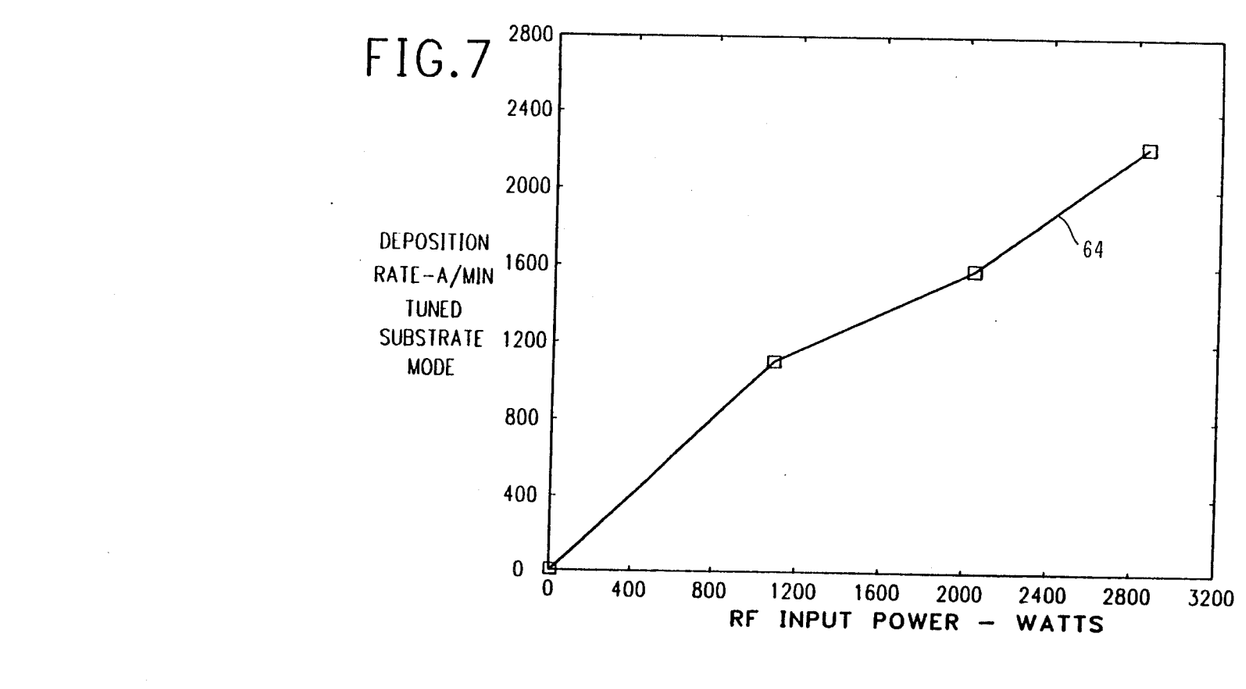
FIG. 7 is a graph of the measured deposition rates for the tuned substrate system of FIG. 3.

Deposition rates versus power are shown in FIG. 6 for low resputtering level 62 and high resputtering level 63 of resputtering, for both modes. A rate of 5000 A/min was exceeded at 7KW in the in-phase mode, at a low resputtering level. In the tuned-substrate mode FIG. 7, resputtering level 64, the power was not raised as high because of the excessively high system voltages which could exceed ratings of matching network components.

Figure 8:
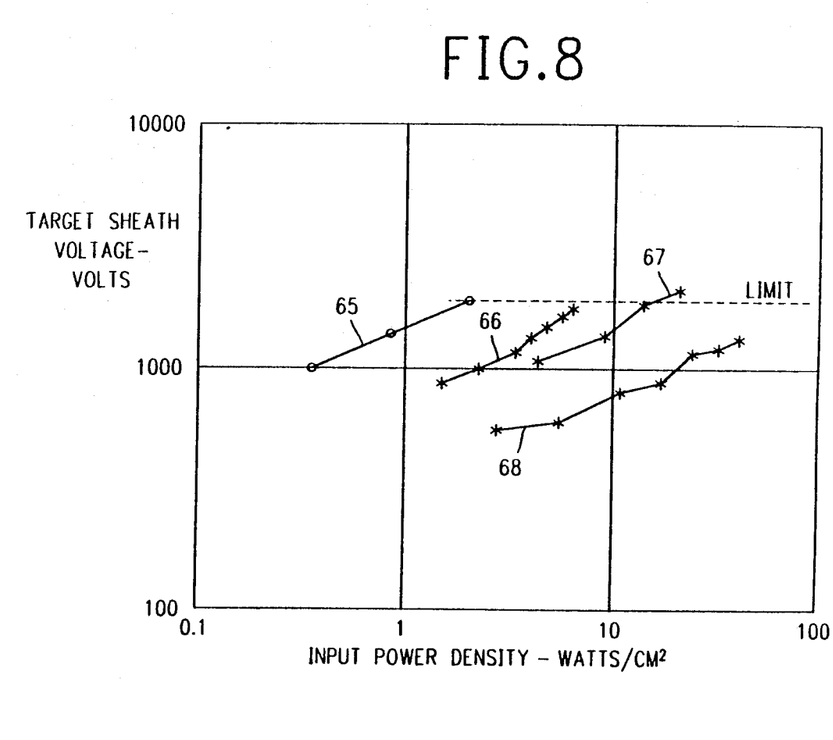
FIG. 8 is a graph of the target sheath voltage versus the system power density for both tuned substrate (diode) and in-phase modes at separate frequencies.

FIG. 8 shows the target sheath voltage vs the total system power density (net rf power divided by target area) for 4 different cases; 13 MHz tuned substrate mode 65 and in-phase mode 66, and 40.68 MHz tuned substrate mode 67 and in-phase mode 68. The use of the highest frequency and the in-phase mode combined gave the lowest voltage/power density curve, which allowed the use of a power density sufficient to reach the desired rate without exceeding those target sheath voltages currently used by those in the art (approximately 2,000).

Figure 9:
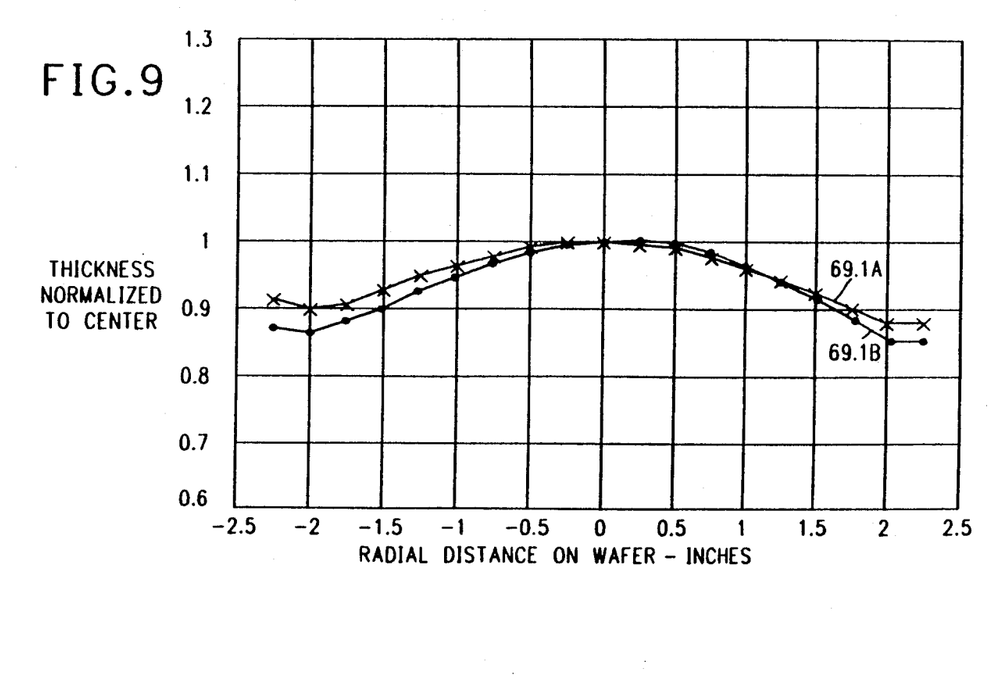
FIG. 9 is a graph of the results of uniformity of film deposit for an in-phase system operating at 50 mTorr.
Figure 10:
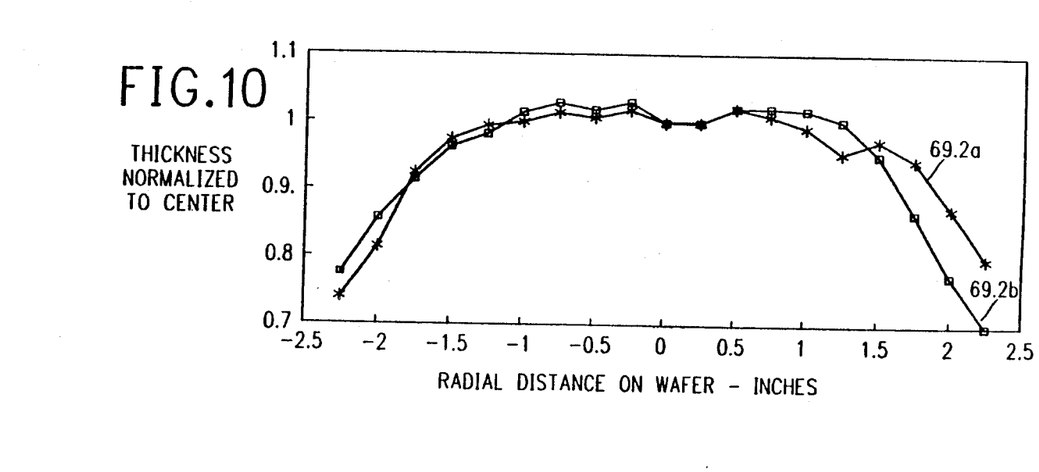
FIG. 10 is a graph of the results of uniformity of film deposit for the apparatus of the tuned substrate of FIG. 3.

FIGS. 9 and 10 show the thickness distribution for the in-phase (7.5 inch, inner diameter) 69.1A and B and tuned substrate (9.0 inch, inner diameter) modes 69.2A and B, respectively. Both apparatii, used symmetrical cathode connections under "standard" resputtering conditions at 3 KW input power and show a symmetrical thickness profile. The A and B curves represent measurements across the orthogonal axii of the wafer.

Figure 111:
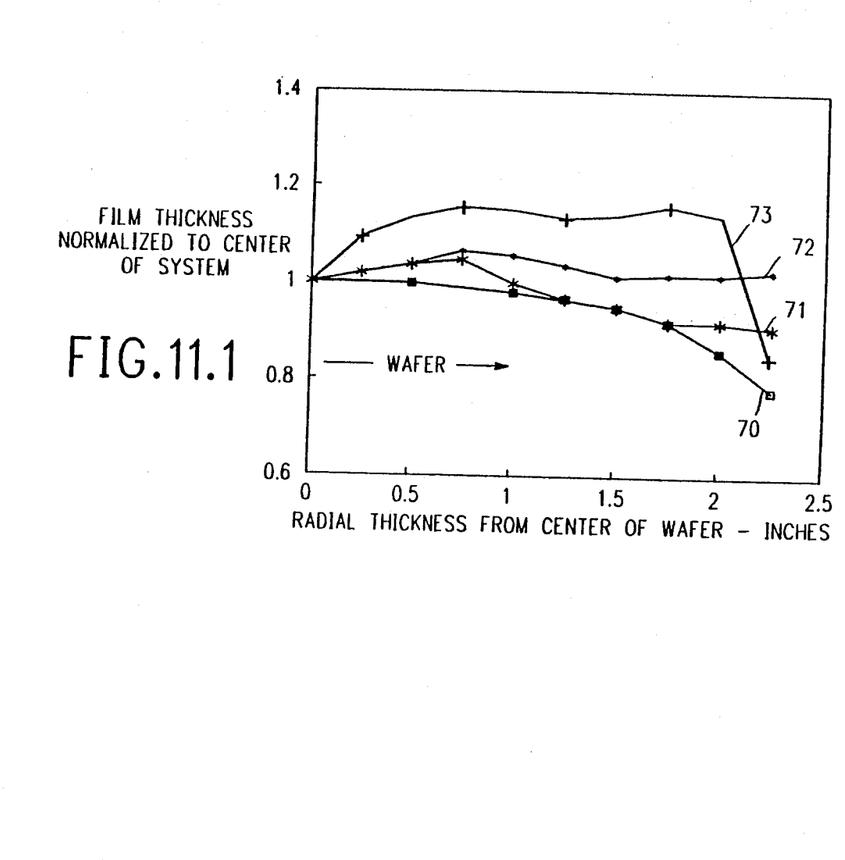
Figure 112:
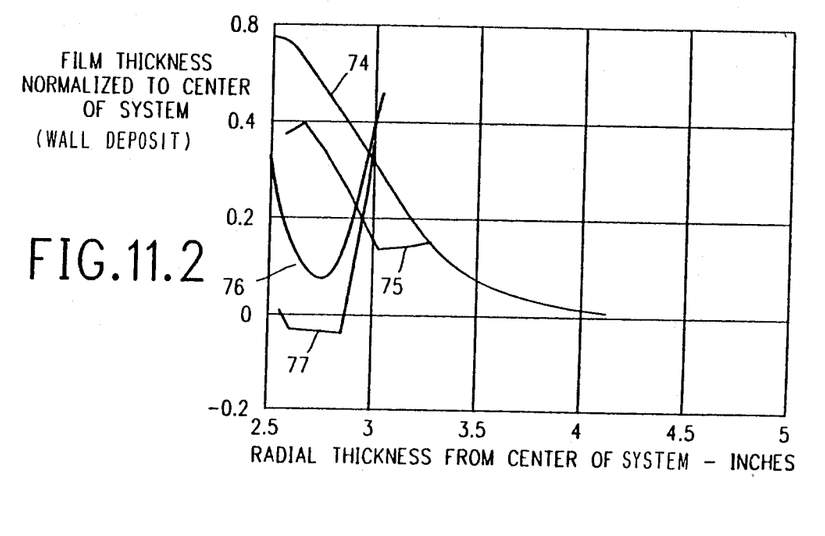

Using the tuned substrate mode, the inner diameter of the wall electrode was changed from 241 mm to 158 mm in four steps. The four steps used resulted in FIG. 11 area ratios (Aw/As) of 5.45 Graphs (70, 74), 1.95 Graphs (71, 75), 1.26 Graphs (72, 76), and 1.04 Graphs (73, 77) respectively. The influence of this change on thickness distribution both on the wafer and on the wall electrode is shown in FIGS. 11.1 and 11.2 and TABLE 1. As the diameter is reduced, the deposit on the wall is reduced and the thickness on the wafer edge is increased. This is due to the expected increase of wall electrode resputtering as the wall electrode area is decreased. At a wall diameter of 158 mm, the wall itself is being etched in some places. At a wall diameter of 163 mm, the wafer thickness profile appears to be nearly ideal, while the wall deposit has been reduced to about 30% at the inner edge, as compared to about 60% for the largest inner diameter.

TABLE 1

| Tuned Substrate Mode: | | |
|---|---|---|
| Wall I.D. (inches) | Area Ratio Aw/As | Max. wall deposit % of center |
| 9.5 | 5.45 | 57% |
| 7.0 | 1.95 | 40% |
| 6.4 | 1.26 | 35% |
| 6.2 | 1.04 | 0% |
| In-Phase Mode: | | |
| Wall I.D. (inches) | Area Ratio Aw/At + As | Max. wall deposit % of Center |
| 7.5 | 1.05 | 23% |

Stress was measured on some runs by measuring wafer deflection using a stylus profilometer. TABLE 2 contains the data for both rf hollow cathode depositions and for tuned substrate depositions. All stress measurements were compressive. The rf in-phase measurements at 3 different power levels show that there is a trend of decreasing stress with increasing power (deposition rate). During these runs, a backside gas pressure of 1 Torr was used, so that the temperature of the wafer would be expected to increase linearly with power. The measurements for the tuned substrate mode were all at a single power using a 3 Torr cooling gas pressure, with a variable substrate bias voltage (variable resputtering). These values were all below $10^9$ dynes/cm$^2$, and showed no apparent correlation to resputtering level. This measurement accuracy is estimated to be ±20%. For comparison, values for these films conventionally deposited usually range between 1.5 and 2.2×10$^9$ dynes/cm$^2$. A low compressive stress is usually desirable for mechanical strength.

TABLE 2

FILM STRESS

IN-PHASE MODE - 9 IN. I.D. CHAMBER

| POWER (WATTS) | RESPUTTERING | DEPOSITION RATE(A/MIN.) | BACKSIDE GAS(TORR) | STRESS ($\times 10^9$ DYNE/CM2) |
|---|---|---|---|---|
| 1000 | PLANAR | 491 | 1 | 3.9 |
| 3000 | PLANAR | 1560 | 1 | 1.48 |
| 5000 | PLANAR | 2250 | 1 | 1.09 |

TUNED SUBSTRATE MODE - 9 IN. I.D. CHAMBER

| POWER (WATTS) | SUBSTR. BIAS(P-P VOLTS) | DEPOSITION RATE(A/MIN.) | BACKSIDE GAS(TORR) | STRESS ($\times 10^9$ DYNE/CM2) |
|---|---|---|---|---|
| 3000 | 350 | 2317 | 5 | 0.69 |
| 3000 | 400 | 2367 | 3 | 0.16 |
| 3000 | 500 | 2402 | 3 | 0.56 |
| 3000 | 600 | 2190 | 3 | 0.63 |
| 3000 | 700 | 1938 | 3 | 0.20 |
| 3000 | 800 | 1773 | 3 | 0.70 |

Refractive index is an indicator of both density and stoichiometry. Thermally grown oxide films on silicon are usually used as a reference. TABLE 3 shows the measurements made at 6328 A and 5461 A using a Rudolph automatic ellipsometer.

TABLE 3

REFRACTIVE INDEX
TUNED SUBSTRATE MODE - 9 IN. I.D. CHAMBER

| POWER (WATTS) | SUBSTR. BIAS (VOLTS) | DEPOSITION RATE(A/MIN.) | REFR. INDEX (6328 A) | REFER. INDEX (5451 A) |
|---|---|---|---|---|
| 3000 | 400 | 2367 | 1.459 (9) | 1.467 (16) |
| 3000 | 500 | 2402 | 1.460 (3) | 1.445 (8) |
| 3000 | 600 | 2190 | 1.456 (14) | 1.440 (13) |
| 3000 | 700 | 1938 | | 1.453 (9) |
| 3000 | 800 | 1773 | 1.458 (7) | 1.434 (9) |
| Thermal SiO$_2$ | | | 1.457 | 1.460 |

The only films characterized this way were films deposited in the tuned substrate mode at different resputtering levels. A number of readings, shown in parentheses, were averaged to get the values tabulated. The values obtained are reasonably close to values for thermal oxide. Small deviations from stoichiometry can increase the refractive index. Density reduction can reduce the index proportionately. Except for the unlikely event of compensating deviations in stoichiometry and density, the numbers indicate near-bulk property films.

Figure 12:
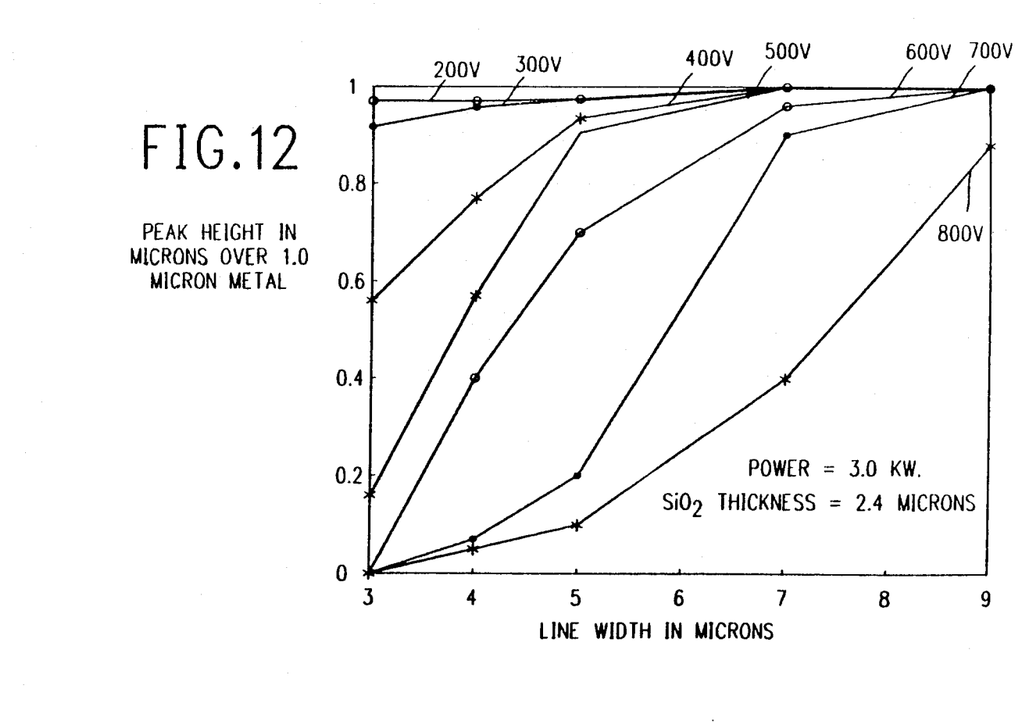
FIG. 12 is a graph of $SiO_2$ peak heights over metal linewidths for various substrate voltages in the tuned substrate mode.

Measurements of SiO$_2$ profile over aluminum metal patterns were made for a series of substrate electrode voltages in the tuned substrate mode only. FIG. 12 shows the peak heights of the SiO$_2$ profile as measured with a SLOAN DEKTAK II profilometer. "Standard" SiO$_2$ conditions would produce no planarization at all, so the 200 V or 300 V curves represent that condition. "Planar" conditions are defined as a peak height of less than 0.2 micron over a 5 micron wide line. Clearly, the 700 volt condition or greater satisfies this condition. Therefore, the system can achieve planarity in the tuned substrate mode at 3 KW.

Thus, while the invention has been described with reference to preferred embodiments thereof, it will be understood by those skilled in the art that various changes in form and details may be made without departing from the scope of the invention.

Having thus described our invention, what we claim as new, and desire to secure by Letters Patent is:

1. In a non-reactive RF sputter etching and/or deposition apparatus wherein a vacuum chamber encloses cathode and anode electrodes having respective areas, said cathode electrode being adapted for having a source target located thereon and said anode electrode being adapted for having workpiece substrates mounted thereon such that said cathode electrode and anode electrode are located in a face to face relationship and having a means for supplying and varying RF voltage applied to said cathode and anode electrodes and wherein said chamber includes means for introducing an ionizable gas into said chamber such that the high frequency and relatively high voltages applied to said electrodes form a plasma there between, the improvement comprising:
   an additional electrode encircling said cathode and anode electrodes and the space therebetween wherein said additional electrode is within and separate from said chamber and has an area approximately equal to or slightly larger than the sum of said cathode electrode and anode electrode areas.

2. An RF sputter etching and/or deposition apparatus according to claim 1 wherein the additional electrode is driven from one terminal of an BF generator and the cathode and anode electrodes provide the return path such that there is an in-phase voltage relationship between said cathode electrode and plasma and said anode electrode and plasma voltages.

3. An RF sputter etching and/or deposition apparatus according to claim 2 wherein the means for introducing the gas flow into said vacuum chamber is from a circular manifold surrounding the anode electrode.

4. An RF sputter etching and/or deposition apparatus according to claim 2 wherein the gas to be introduced into said vacuum chamber is selected from the group of noble gases.

5. An RF sputter etching and/or deposition apparatus according to claim 4 wherein the gas to be introduced into said vacuum chamber is selected form the group of argon, xenon or krypton.

6. An RF sputter etching and/or deposition apparatus according to claim 1 wherein said cathode electrode and anode electrode are the driven electrodes and said additional electrode provides the return path such that the voltage relationship between said cathode electrode and plasma and said anode electrode and plasma voltage is in-phase.

7. An RF sputter etching and/or deposition apparatus according to claim 6 wherein the means of introducing the gas flow into said vacuum chamber is from a circular manifold surrounding the anode electrode.

8. An RF sputter etching and/or deposition apparatus according to claim 6 wherein the gas to be introduced into said vacuum chamber is selected from the group of noble gases.

9. An RF sputter etching and/or deposition apparatus according to claim 8 wherein the gas to be introduced into said vacuum chamber is selected from the group of argon, xenon or krypton.

* * * * *